United States Patent [19]

Huang

[11] Patent Number: 5,724,377

[45] Date of Patent: Mar. 3, 1998

[54] METHOD AND APPARATUS FOR IMPROVING THE INSTABILITY OF A LASER

[75] Inventor: Sun-Yuan Huang, Maidencreek Township, Berks County, Pa.

[73] Assignee: Lucent Technologies Inc., Murray Hill, N.J.

[21] Appl. No.: 608,874

[22] Filed: Feb. 29, 1996

[51] Int. Cl.$^6$ ................... H01S 3/08; G02B 6/34; G01B 9/02

[52] U.S. Cl. ................... 372/98; 372/6; 372/21; 372/22; 372/102; 385/37; 356/352

[58] Field of Search ................... 372/6, 18, 21, 372/22, 23, 29, 32, 92, 98, 102, 108; 385/37, 24; 356/352

[56] References Cited

U.S. PATENT DOCUMENTS

| | | | |
|---|---|---|---|
| 4,468,773 | 8/1984 | Seaton | 372/32 |
| 4,817,100 | 3/1989 | Cameron et al. | 372/32 |
| 4,993,032 | 2/1991 | Bradley | 372/20 |
| 5,218,655 | 6/1993 | Mizrahi | 385/39 |
| 5,251,229 | 10/1993 | Bennett, Jr. et al. | 372/92 |
| 5,343,542 | 8/1994 | Kash et al. | 385/31 |
| 5,397,891 | 3/1995 | Udd et al. | 356/345 |
| 5,475,780 | 12/1995 | Mizrahi | 385/37 |
| 5,485,481 | 1/1996 | Ventrudo et al. | 372/6 |
| 5,570,440 | 10/1996 | Mizrahi | 385/37 |

OTHER PUBLICATIONS

S.Y. Huang, "Optical-feedback-induced degradations of the spectrum and the kink current of 980-nm pump lasers", *Cleo'95 Technical Digest*, pp. 76-77, (1995).

*Primary Examiner*—Brian Healy
*Attorney, Agent, or Firm*—Vernon E. Williams; Patricia A. Verlangieri

[57] ABSTRACT

A method of reducing undulation in the L vs. I curve of a laser which uses a fiber grating is presented. The spectral width of the fiber grating is made larger than the Fabry-Perot spacing of the laser cavity. As a result, as the laser shifts between harmonics due to laser functioning (e.g., laser drive current, laser aging, temperature change, or mechanical stress), the fiber grating is able to respond linearly because of a large spectral width.

11 Claims, 3 Drawing Sheets

METHOD AND APPARATUS FOR IMPROVING THE INSTABILITY OF A LASER

TECHNICAL FIELD

This invention relates to the field of lasers.

BACKGROUND OF THE INVENTION

In current laser technology, material (e.g. semiconductors, gas, solid-state materials) is positioned between two precisely aligned optical mirrors. One of the mirrors is nearly 100% reflective (e.g., 95%), and the other mirror is partially reflective (e.g. 1%, 5%). An outside source (e.g., and initial current) is used to excite the electrons of the material positioned between the two mirrors. As the electrons are excited, the electrons release light which reflects back and forth between the two mirrors. The two mirrors and the material positioned in between the two mirrors form a resonator that bounces the light back and forth. As the light bounces back and forth, light moving in the same aligned direction, is ejected from the cavity as a laser light.

When the material between the reflective mirrors is a semiconductor material, most of the unexcited electrons reside in an area known as the valance band. The valance band is a low energy state. As the electrons are excited they jump across an area known as the bandgap of the semiconductor to a region known as the conduction band. The conduction band is a high energy state. In the conduction band the electrons are in an excited state. When laser light is ejected from the resonator most of the electrons are located in the conduction band. In order for laser light to be ejected from the resonator, enough of the electrons have to leave the valance band and enter the conduction band. A higher population of electrons in the conduction band, than in the valance band is known as population inversion.

The energy of the light in the resonator can be described by wavelength or frequency. The relationship $\lambda \times E = hc$, defines the relationship between energy, wavelength and frequency, where E is energy, $\lambda$, is wavelength, h is Planck's constant and c is the speed of light in a vacuum. However, when a semiconductor is used as a laser material, the speed of light is changed to the speed of light in that material. Therefore when a semiconductor is used, the laser is characterized by the ratio of the speed of light in a vacuum to the speed of light in the semiconductor material. This characteristic is known as the refractive index of the material.

As different wavelengths of light resonate in the cavity, the different wavelengths of light resonate at different frequencies. The light resonates over a range of frequencies or harmonics. Although most lasers will have a dominant frequency, a typical laser cavity will also have sub frequencies or harmonics of the dominant frequency, these harmonics are called Fabry-Perot (FP) modes. FIG. 1 displays a graph of the laser gain on the y-axis, versus the laser wavelength on the x-axis. In FIG. 1 a dominant frequency 2 and harmonics 4 are displayed. The peaks of the dominant frequency 2 and the harmonics 4 define the gain curve 6. The spacing between two frequencies of the laser is the Fabry-Perot spacing 8. A laser normally operates at one dominant frequency, such as the dominant frequency 2. However, operating conditions (e.g. laser drive current, temperature, external reflections) can cause a laser to switch from the dominant frequency, to one of the harmonic frequencies 4. The switching between modes (known as mode jump) causes the laser to be unstable.

Stability of the dominant frequency depends on the laser material, and the external reflection of laser light back to the laser cavity. For example, it has been found in lasers without a grating, that even small reflections of the output laser light back to the cavity, causes laser instability ( see, S. Y. Huang, "Optical-feedback-induced degradations of the spectrum and the kink current of 980-nm pump lasers", CLEO'95 Technical Digest, pp. 76–77, Baltimore, May 1995). As a result several techniques have been developed to handle laser instability due to reflections. One technique uses a device known as a fiber grating. A fiber grating is placed in the output light stream of a laser and coherently reflects the dominant frequency of the laser light back into the laser cavity. Therefore the grating enhances the dominant frequency of the laser light which in mm reduces instability. Normally, in a laser with a particular wavelength such as a 980 nm pump laser, the fiber grating is designed so that the grating enhances the 980 nm wavelength harmonic and suppresses any other harmonics. Therefore the wavelength that the fiber grating reflects is usually centered around 980 nm. Most fiber gratings are usually designed to handle the specific dominant frequency of the laser, therefore the bandwidth of most fiber gratings is narrow. For a typical fiber grating, when the reflectivity (ability of the grating to reflect light) of the grating is plotted as a function of wavelength, the plot appears as a gaussian curve displayed in FIG. 2. In FIG. 2 the x axis represents the wavelength traversing the fiber grating and the y axis represents the reflectivity of the fiber grating at that wavelength. In addition, the line 10 is known as the full-width half maximum (FWHM) spectral width of the fiber grating. The spectral width is the wavelength range for which the fiber grating can reflect light. The FWHM is a measurement of the fiber grating, and is defined as the wavelength at which the rising pulse passes 50% of the peak reflectivity, to the wavelength at which the reflectivity drops below the 50% point.

The fiber gratings are used in conjunction with a laser (e.g., a semiconductor laser). Semiconductor lasers have active materials whose refractive index is a function of temperature. In order for a laser to be stable the output optical power of the laser should be maintained constant against laser aging, ambient temperature change and mechanical stress. Therefore a feedback loop is often used in semiconductor lasers to try to maintain stability in the laser. An initial current provides initial energy which causes electrons and holes to inject into the conduction band and valance band, respectively, and produce population inversion. In some lasers a feedback loop is achieved by using a detector to detect small amounts of optical output power emitting from the rear of the laser (using a rear monitor) and feeding the power back into the initial current. As a result, a constant output power is maintained at the front of the laser. In order for this feedback control mechanism to work, the rear output power has to be linear over a certain current range. However, when current is injected into a semiconductor laser, part of the electrical power is converted into heat, resulting in an increase in the temperature of the laser material. As the semiconductor material increases in temperature the index of refraction of the material changes. The change of the index of refraction of the semiconductor material in turn shifts the dominant harmonic frequency of the laser. Therefore, as the current fed into the laser increases, the dominant harmonic shifts.

When a fiber grating is used with the semiconductor laser and the dominant frequency coincides with the grating mode the output power increases, and when the dominant harmonic moves away from the grating mode the output power decreases. This phenomena of switching between dominant harmonic modes is the mode jump discussed earlier. If the fiber light output power (L) and the rear monitor current ($I_{bd}$), is plotted as a function of the laser current (I), the mode jump shows up as undulation in the L vs. I curve 10 and $I_{bd}$ vs. I curve 20 of FIG. 3. It would be advantageous to stabilize the laser, thereby diminishing the amount of undulation in both the L vs. I curve 10 and $I_{bd}$ vs. I curve 20.

SUMMARY OF THE INVENTION

The present invention discloses a method and apparatus for increasing the stability of a laser. A configuration is defined between a semiconductor laser and a fiber grating to stabilize such a laser, thereby reducing the undulation in the L vs. I curve and the $I_{bd}$ vs. I curves. Specifically, a grating with a spectral width that is between about two to about four times larger than the FP spacing of the laser is defined, so that there is one dominant harmonic in the laser output, or during the transition from one dominant mode to the next dominant mode the front and rear output power is linear as the laser current drive increases. Decreasing the undulation is accomplished by increasing the bandwidth of the fiber grating so that the grating couples the laser output to produce a linear L v. I curve. In the present invention, the full width half maximum spectral width of the fiber grating is set to between about 0.4 nm to about 0.6 nm for a 980 nm laser with a Fabry-Perot spacing of 0.17 nm.

BRIEF DESCRIPTION OF THE DRAWINGS

The objects, advantages and novel features of the invention will be more fully apparent from the following detailed description when read in connection with the accompanying drawings wherein.

DETAILED DESCRIPTION OF THE INVENTION

Figure 1:
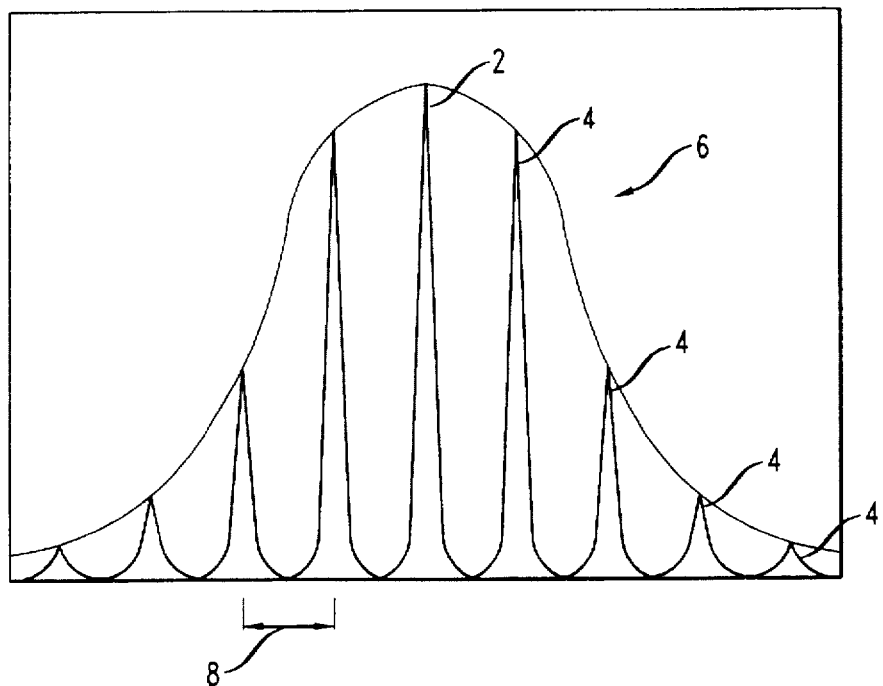
FIG. 1. displays a curve of the gain versus wavelength.
Figure 2:
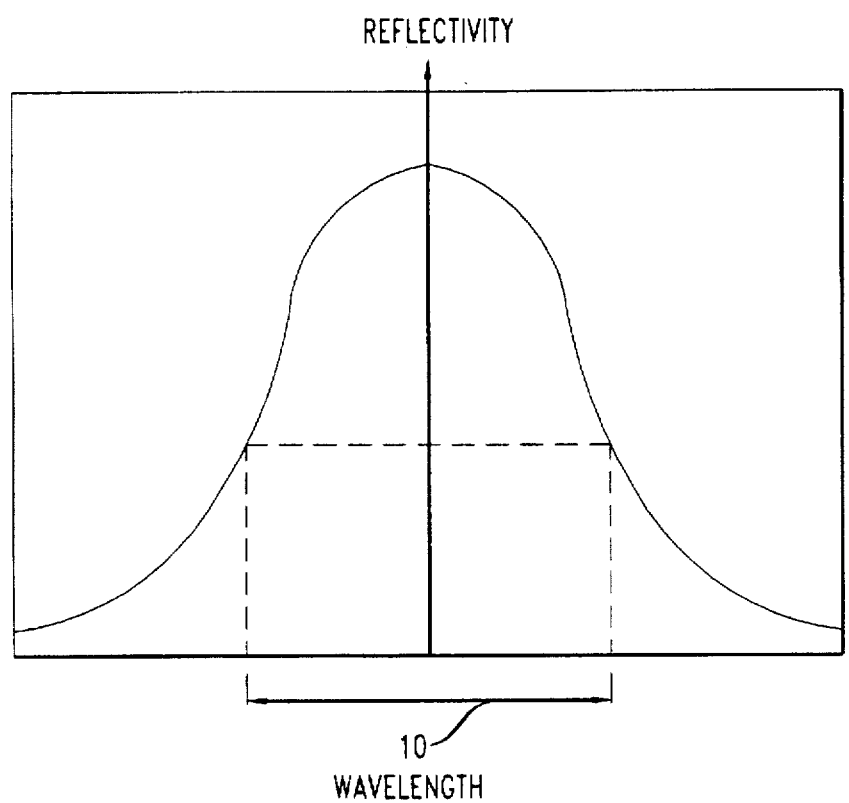
FIG. 2. displays the reflectivity curve of a fiber grating.
Figure 3:
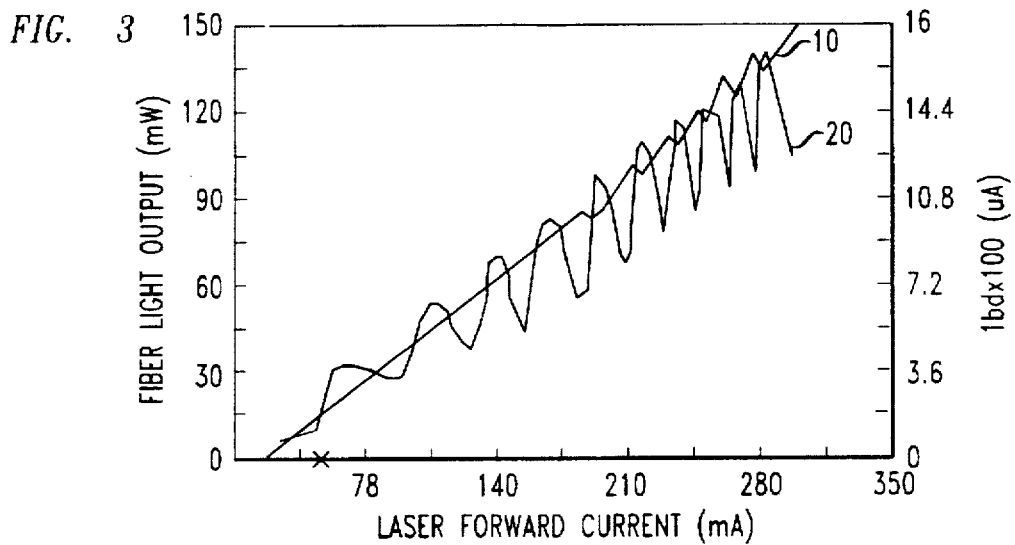
FIG. 3. displays a graph of the fiber light output vs. the laser forward current, where the spectral width is less than 0.01 nm.
Figure 4:
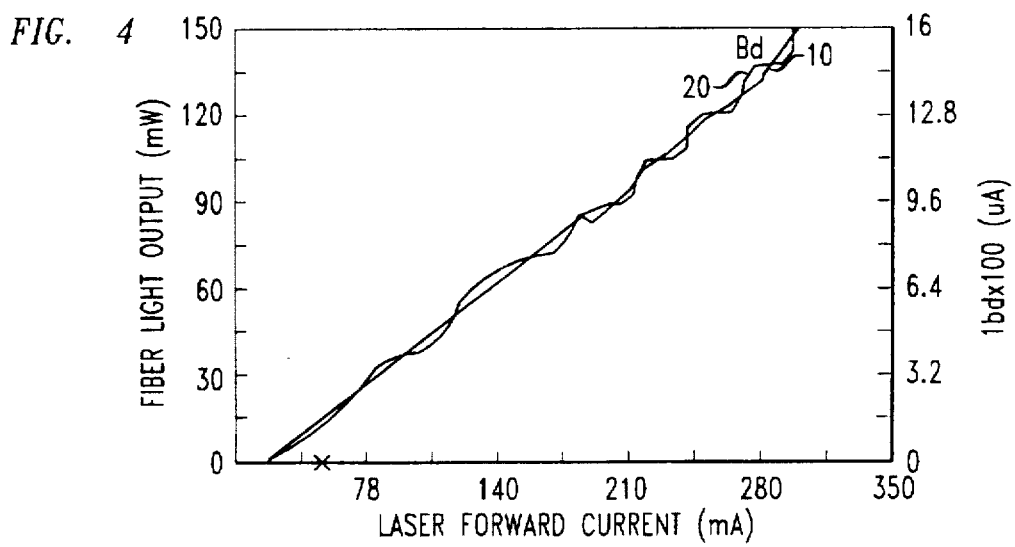
FIG. 4. displays the fiber light output vs. laser forward current of the present invention, where the spectral width is 0.19 nm.
Figure 5:
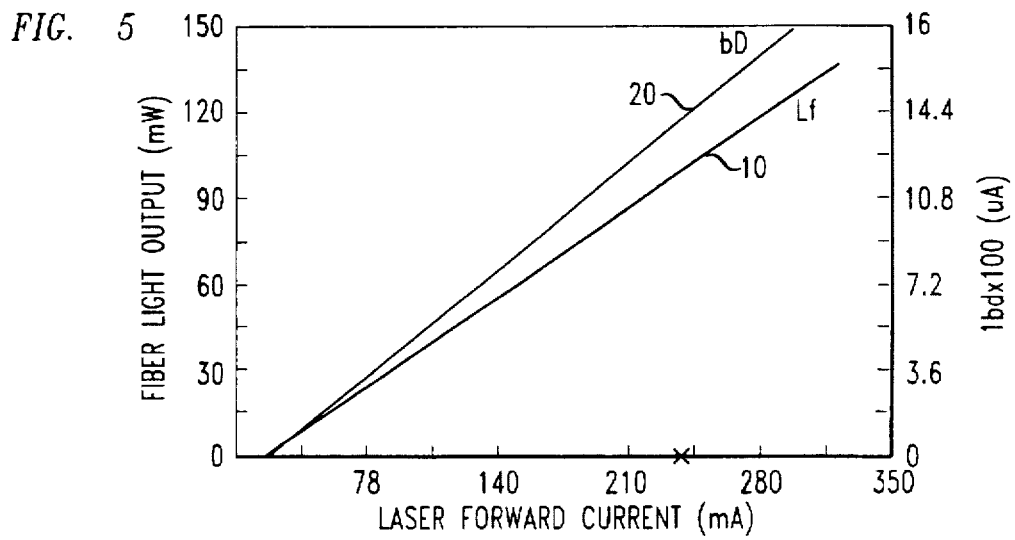
FIG. 5. displays the fiber light output vs. laser forward current of the present invention, where the spectral width is 0.58 nm.

In the architecture disclosed in the present invention, the spectral width of a fiber grating is made larger than the FP spacing of the laser cavity. As a result, even though there is a mode jump in the laser output, the harmonics of the laser will fall within the bandwidth of the fiber grating. For example, in a 980 nm pump laser, the dominant frequency or mode would be centered at 980 nm. The next harmonic of the dominant frequency may occur at 980.17 nm, therefore the FP spacing for this laser is 0.17 nm. When the spectral width of the fiber grating is increased to 0.19 nm which is 0.02 nm larger than the FP spacing, the curve displayed in FIG. 4 occurs. The undulation in both the L vs. I curve 10 and the $I_{bd}$ vs. I curve 20, decreases. When the spectral width of the fiber grating is increased to 0.58 nm, which is 0.41 nm larger than the FP spacing of the laser cavity, the undulation in the L vs. I curve and the $I_{bd}$ vs. I curve are diminished even further, as displayed in FIG. 5. It should be appreciated that the amount of decrease in the undulation of the L vs. I curve and the $I_{bd}$ vs. I curve that is considered acceptable, is dependent on the specific application that the laser is being used for. However, many applications will require that the L vs. I curve and the $I_{bd}$ vs. I curve are as smooth as possible. For example the present invention utilizes the laser as a pump source for an optical amplifier, therefore a fiber grating with a spectral width that is about 3 times the FP spacing of the laser would be most desirable, since a fiber grating with a spectral width that is about 3 times the FP spacing of the laser, produces a straight L vs. I curve and $I_{bd}$ vs. I curve. A control sample is lastly used to determine the FWHM spectral width needed for a particular FP spacing and a desired degree of undulation reduction.

The decrease in the undulation in the L vs. I curve and the $I_{bd}$ vs. I curve results from using a spectral width of the fiber grating that is larger than the FP spacing of the laser cavity. As a result, the fiber grating can accommodate the transitions (mode jump) between the peaks of the different harmonics linearly. In other words as the laser transitions between the peak of one mode and the peak of another mode, the laser output light is still within the bandwidth of the fiber gratings spectral width. In previous grating configurations (e.g., where the spectral width of the fiber grating is <0.01 nm) as the laser moved from one harmonic to another, the laser would move outside of the spectral width of the grating. As a result, the fiber grating would reflect light back to the laser cavity non-uniformly. In the method and apparatus of the present invention, when the spectral width of the fiber grating is greater than the FP spacing, as the laser cavity jumps from one mode to another, the transition between modes still falls within the bandwidth of the fiber grating. Therefore a constant uniform feedback of optical power is returned to the laser cavity, and a linear L vs. I curve results.

Figure 6:
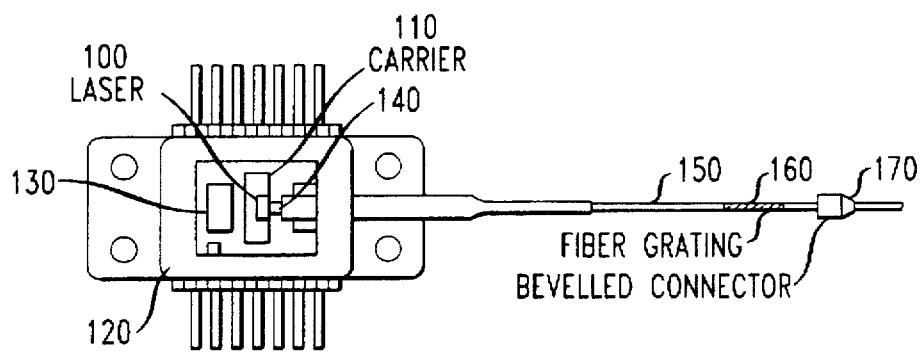
FIG. 6. displays a schematic diagram of the present invention.

FIG. 6 displays an illustrative example of the apparatus used in the present invention. For the purposes of the invention, the laser such as a multimode laser should display a Fabry-Perot mode. In FIG. 6 a semiconductor laser chip 100 is mounted in a laser carrier 110. The laser carrier 110 is composed of aluminum nitride or beryllium oxide. However, it should be appreciated that the laser carrier could be any material that displays a high thermal conductivity because one of the purposes of the laser carrier is to dissipate heat from the laser. In addition the laser carrier 110 should have an expansion coefficient that matches the laser chip so that there is less expansion stress in the laser chip. The laser carrier provides a vehicle support for the laser chip 100 and serves as a heat sink. Front light emission from the laser 100 is coupled to a single mode fiber 150 through a micro lens 140. The single mode fiber 150 is terminated with a beveled connector 170. Rear light emission of the laser 100 is monitored by a photodiode 130. The laser 100, the laser carrier 110, the photodiode 130, and the microlens 140 are all housed in a laser module 120. The laser module 120 has a height of 0.3 inches, a length of 1 inch, and a width of 0.5 inches.

A first order fiber grating 160 with a length of around 1 cm is located about 5 to about 40 inches away from the laser chip 100. However, it should be appreciated that if the fiber has a smaller change of the index of refraction a longer grating should be used and conversely, if the fiber has a larger change of the index of refraction a shorter grating can be used. For example, the fiber grating 160 has the parameters given in Table I:

TABLE I

| Parameter | Min | Max | Unit |
| --- | --- | --- | --- |
| Grating Peak Reflectance | 1 | 3 | % |
| Center Wavelength | 978 | 982 | nm |
| Spectral Width(FWHM) | 0.4 | 0.6 | nm |
| Spectral Side Mode Suppression | 10 Ratio | — | dB |
| Temperature Tuning Rate | −0.02 | 0.02 | nm/DEG °C. |

Figure 7:
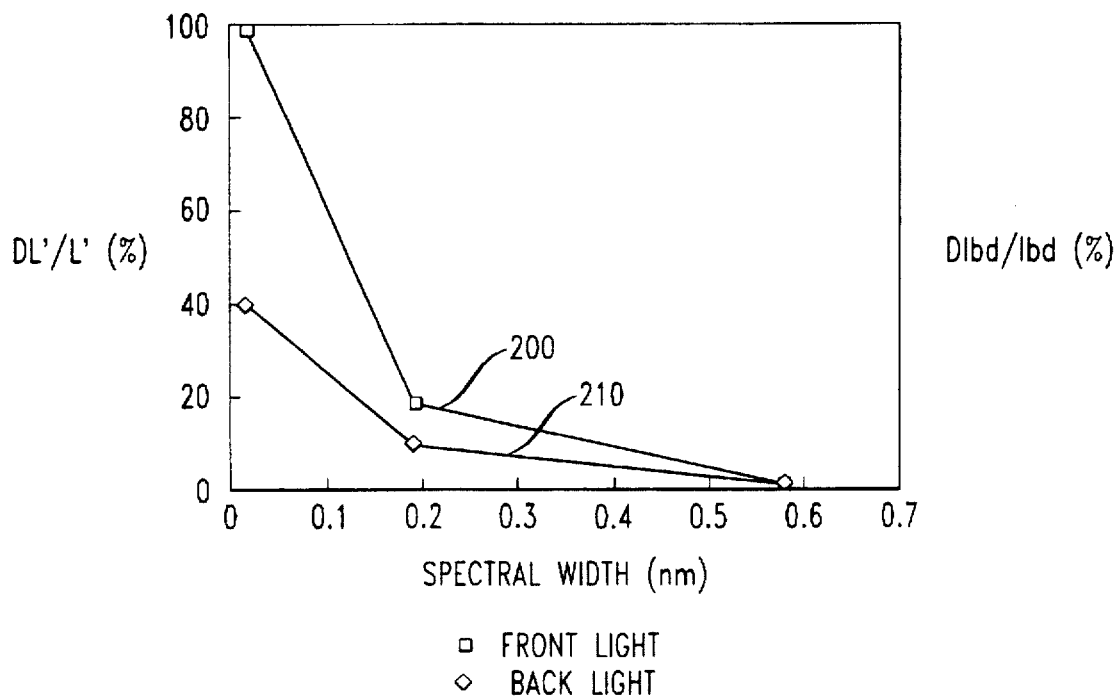
FIG. 7. displays the front and back LI linearity as a function of the Fiber Grating Spectral Width.

Utilizing a grating with the characteristics described in Table I, results in a more stable 980 nm semiconductor laser. FIG. 7 displays the front and back light performance of the laser and grating used in the present invention. In FIG. 7, the spectral width of the fiber grating are plotted as a function of the first derivative change in optical power 200 (DL'/L') and the change in monitor current 210 ($DI_{bd}/I_{bd}$). As detailed in the graph, as the spectral width increases, the change in optical power and monitor current decreases. For example, as the spectral width is increased from 0 to 0.2 nm both the front light 200 and the back light 210, decrease drastically. Between the spectral width ranges of 0.2 nm and 0.6 nm, both the front light 200 and the back light 210 experience a gradual decrease.

While several embodiments of the invention are disclosed and described, it should be appreciated that various modifications may be made without departing from the spirit of the invention or the scope of the subjoined claims.

The invention claimed is:

1. A method of generating light from a laser, said method comprising the steps of:

generating light with Fabry-Perot spacing from said laser, and receiving said light in a fiber grating wherein said grating has a spectral width between about 2 to about 4 times larger than said Fabry-Perot spacing.

2. A method of generating light from a laser, said method comprising the steps of:

generating light from said laser wherein said light includes harmonics with Fabry-Perot spacing, and receiving said light in a fiber grating wherein said fiber grating has a spectral width greater than said Fabry-Perot spacing.

3. A method as claimed in claim 2 wherein said fiber grating is positioned between about 5 to about 40 inches from said laser.

4. A method as claimed in claim 2 wherein said fiber grating is a first order grating.

5. A method as claimed in claim 3 wherein said fiber grating is about 1 cm in length.

6. A method as claimed in claim 2 wherein said laser has Fabry-Perot spacing of about 0.17 nm.

7. A method as claimed in claim 6 wherein said fiber grating has a grating peak reflectance of between about 1% and about 3%.

8. A method as claimed in claim 6 wherein said fiber grating has a center wavelength between about 978 nm and about 982 nm.

9. A method as claimed in claim 6 whereto said fiber grating has a spectral width of about 0.4 nm to about 0.6 nm.

10. A method as claimed in claim 6 wherein said fiber grating has a side mode suppression ratio of greater than 10 dB.

11. A method as claimed in claim 6 wherein said fiber grating has a temperature tuning rate of about −0.02 nm/DEG C to about 0.02 nm/DEC C.

* * * * *

UNITED STATES PATENT AND TRADEMARK OFFICE
CERTIFICATE OF CORRECTION

PATENT NO. : 5,724,377
DATED : March 3, 1998
INVENTOR(S) : Huang, Sun-Yuan

It is certified that error appears in the above-indentified patent and that said Letters Patent is hereby corrected as shown below:

Column 6, Claim 11, line 33: change "nm/DEC C" to --nm/DEG C--.

Signed and Sealed this

Seventh Day of July, 1998

Attest:

Attesting Officer

BRUCE LEHMAN

Commissioner of Patents and Trademarks